US007476907B2

(12) United States Patent
Gorrell et al.

(10) Patent No.: US 7,476,907 B2
(45) Date of Patent: Jan. 13, 2009

(54) PLATED MULTI-FACETED REFLECTOR

(75) Inventors: Jonathan Gorrell, Gainesville, FL (US); Andres Trucco, Gainesville, FL (US)

(73) Assignee: Virgin Island Microsystems, Inc., St. Thomas (VG)

( * ) Notice: Subject to any disclaimer, the term of this patent is extended or adjusted under 35 U.S.C. 154(b) by 60 days.

(21) Appl. No.: 11/418,264

(22) Filed: May 5, 2006

(65) Prior Publication Data

US 2007/0257621 A1 Nov. 8, 2007

(51) Int. Cl.
*H01L 33/00* (2006.01)
*H01S 3/08* (2006.01)

(52) U.S. Cl. .................. 257/88; 257/98; 257/E33.072; 372/49.01; 372/99

(58) Field of Classification Search .................. 257/88, 257/98, 99, E33.069, E33.072; 372/49.01, 372/99
See application file for complete search history.

(56) References Cited

U.S. PATENT DOCUMENTS 1,948,384 A 2/1934 Lawrence
2,307,086 A 1/1943 Varian et al.
2,431,396 A 11/1947 Hansell
2,473,477 A 6/1949 Smith
2,634,372 A 4/1953 Salisbury
2,932,798 A 4/1960 Kerst et al.
2,944,183 A 7/1960 Drexler
2,966,611 A 12/1960 Sandstrom
3,231,779 A 1/1966 White
3,297,905 A 1/1967 Fiedor et al.
3,543,147 A 11/1970 Kovarik
3,571,642 A 3/1971 Westcott
3,586,899 A 6/1971 Fleisher
3,761,828 A 9/1973 Pollard et al.
3,886,399 A 5/1975 Symons
3,923,568 A 12/1975 Bersin
3,989,347 A 11/1976 Eschler
4,282,436 A 8/1981 Kapetanakos
4,482,779 A 11/1984 Anderson
4,712,042 A 12/1987 Hamm
4,713,581 A 12/1987 Haimson
4,727,550 A 2/1988 Chang et al.
4,740,973 A 4/1988 Madey (Continued)

FOREIGN PATENT DOCUMENTS

EP 0237559 B1 12/1991

(Continued)

OTHER PUBLICATIONS

Search Report and Written Opinion mailed Aug. 24, 2007 in PCT Appln. No. PCT/US2006/022768.

(Continued)

*Primary Examiner*—Minh-Loan T Tran
(74) *Attorney, Agent, or Firm*—Davidson Berquist Jackson & Gowdey, LLP

(57) ABSTRACT

A nano-resonating structure constructed and adapted to include additional ultra-small structures that can be formed with reflective surfaces. By positioning such ultra-small structures adjacent ultra-small resonant structures the light or other EMR being produced by the ultra-small resonant structures when excited can be reflected in multiple directions. This permits the light or EMR out put to be viewed and used in multiple directions.

20 Claims, 5 Drawing Sheets

U.S. PATENT DOCUMENTS

| | | | |
|---|---|---|---|
| 4,746,201 | A | 5/1988 | Gould |
| 4,829,527 | A | 5/1989 | Wortman et al. |
| 4,838,021 | A | 6/1989 | Beattie |
| 4,864,131 | A | 9/1989 | Rich et al. |
| 5,023,563 | A | 6/1991 | Harvey et al. |
| 5,113,141 | A | 5/1992 | Swenson |
| 5,128,729 | A | 7/1992 | Alonas et al. |
| 5,157,000 | A | 10/1992 | Elkind et al. |
| 5,163,118 | A | 11/1992 | Lorenzo et al. |
| 5,185,073 | A | 2/1993 | Bindra |
| 5,199,918 | A | 4/1993 | Kumar |
| 5,235,248 | A | 8/1993 | Clark et al. |
| 5,262,656 | A | 11/1993 | Blondeau et al. |
| 5,263,043 | A | 11/1993 | Walsh |
| 5,268,693 | A | 12/1993 | Walsh |
| 5,268,788 | A | 12/1993 | Fox et al. |
| 5,302,240 | A | 4/1994 | Hori et al. |
| 5,354,709 | A | 10/1994 | Lorenzo et al. |
| 5,446,814 | A | 8/1995 | Kuo et al. |
| 5,504,341 | A | 4/1996 | Glavish |
| 5,578,909 | A | 11/1996 | Billen |
| 5,608,263 | A | 3/1997 | Drayton et al. |
| 5,666,020 | A | 9/1997 | Takemura |
| 5,668,368 | A | 9/1997 | Sakai et al. |
| 5,705,443 | A | 1/1998 | Stauf et al. |
| 5,737,458 | A | 4/1998 | Wojnarowski et al. |
| 5,744,919 | A | 4/1998 | Mishin et al. |
| 5,757,009 | A | 5/1998 | Walstrom |
| 5,767,013 | A | 6/1998 | Park |
| 5,790,585 | A | 8/1998 | Walsh |
| 5,811,943 | A | 9/1998 | Mishin et al. |
| 5,821,836 | A | 10/1998 | Katehi et al. |
| 5,821,902 | A | 10/1998 | Keen |
| 5,825,140 | A | 10/1998 | Fujisawa |
| 5,831,270 | A | 11/1998 | Nakasuji |
| 5,847,745 | A | 12/1998 | Shimizu et al. |
| 5,889,449 | A | 3/1999 | Fiedziuszko |
| 5,902,489 | A | 5/1999 | Yasuda et al. |
| 6,008,496 | A | 12/1999 | Winefordner et al. |
| 6,040,625 | A | 3/2000 | Ip |
| 6,060,833 | A | 5/2000 | Velazco |
| 6,080,529 | A | 6/2000 | Ye et al. |
| 6,139,760 | A | 10/2000 | Shim et al. |
| 6,195,199 | B1 | 2/2001 | Yamada |
| 6,222,866 | B1 | 4/2001 | Seko |
| 6,278,239 | B1 | 8/2001 | Caporaso et al. |
| 6,281,769 | B1 | 8/2001 | Fiedziuszko |
| 6,297,511 | B1 | 10/2001 | Syllaios et al. |
| 6,316,876 | B1 | 11/2001 | Tanabe |
| 6,338,968 | B1 | 1/2002 | Hefti |
| 6,370,306 | B1 | 4/2002 | Sato et al. |
| 6,373,194 | B1 | 4/2002 | Small |
| 6,376,258 | B2 | 4/2002 | Hefti |
| 6,407,516 | B1 | 6/2002 | Victor |
| 6,441,298 | B1 | 8/2002 | Thio |
| 6,453,087 | B2 | 9/2002 | Frish et al. |
| 6,470,198 | B1 | 10/2002 | Kintaka et al. |
| 6,504,303 | B2 | 1/2003 | Small |
| 6,525,477 | B2 | 2/2003 | Small |
| 6,545,425 | B2 | 4/2003 | Victor |
| 6,577,040 | B2 | 6/2003 | Nguyen |
| 6,603,915 | B2 | 8/2003 | Glebov et al. |
| 6,624,916 | B1 | 9/2003 | Green et al. |
| 6,636,653 | B2 | 10/2003 | Miracky et al. |
| 6,640,023 | B2 | 10/2003 | Miller et al. |
| 6,642,907 | B2 | 11/2003 | Hamada et al. |
| 6,738,176 | B2 | 5/2004 | Rabinowitz et al. |
| 6,741,781 | B2 | 5/2004 | Furuyama |
| 6,782,205 | B2 | 8/2004 | Trisnadi et al. |
| 6,791,438 | B2 | 9/2004 | Takahashi et al. |
| 6,829,286 | B1 | 12/2004 | Guilfoyle et al. |
| 6,834,152 | B2 | 12/2004 | Gunn et al. |
| 6,870,438 | B1 | 3/2005 | Shino et al. |
| 6,885,262 | B2 | 4/2005 | Nishimura et al. |
| 6,909,092 | B2 | 6/2005 | Nagahama |
| 6,909,104 | B1 | 6/2005 | Koops et al. |
| 6,943,650 | B2 | 9/2005 | Ramprasad et al. |
| 6,944,369 | B2 | 9/2005 | Deliwala |
| 6,953,291 | B2 | 10/2005 | Liu |
| 6,965,284 | B2 | 11/2005 | Maekawa et al. |
| 6,965,625 | B2 | 11/2005 | Mross et al. |
| 6,972,439 | B1 | 12/2005 | Kim et al. |
| 6,995,406 | B2 | 2/2006 | Tojo et al. |
| 7,010,183 | B2 | 3/2006 | Estes et al. |
| 7,092,588 | B2 | 8/2006 | Kondo |
| 7,092,603 | B2 | 8/2006 | Glebov et al. |
| 7,122,978 | B2 | 10/2006 | Nakanishi et al. |
| 7,177,515 | B2 | 2/2007 | Estes et al. |
| 7,230,201 | B1 | 6/2007 | Miley et al. |
| 7,267,459 | B2 | 9/2007 | Matheson |
| 7,267,461 | B2 | 9/2007 | Kan et al. |
| 2001/0025925 | A1 | 10/2001 | Abe et al. |
| 2002/0009723 | A1 | 1/2002 | Hefti |
| 2002/0027481 | A1 | 3/2002 | Fiedziuszko |
| 2002/0036121 | A1 | 3/2002 | Ball et al. |
| 2002/0036264 | A1 | 3/2002 | Nakasuji et al. |
| 2002/0053638 | A1 | 5/2002 | Winkler et al. |
| 2002/0071457 | A1 | 6/2002 | Hogan |
| 2002/0135665 | A1 | 9/2002 | Gardner |
| 2003/0012925 | A1 | 1/2003 | Gorrell |
| 2003/0016412 | A1 | 1/2003 | Small |
| 2003/0016421 | A1 | 1/2003 | Small |
| 2003/0034535 | A1 | 2/2003 | Barenburu et al. |
| 2003/0155521 | A1 | 8/2003 | Feuerbaum |
| 2003/0158474 | A1 | 8/2003 | Scherer et al. |
| 2003/0164947 | A1 | 9/2003 | Vaupel |
| 2003/0179974 | A1 | 9/2003 | Estes et al. |
| 2003/0206708 | A1 | 11/2003 | Estes et al. |
| 2003/0214695 | A1* | 11/2003 | Abramson et al. .......... 359/265 |
| 2004/0061053 | A1 | 4/2004 | Taniguchi et al. |
| 2004/0085159 | A1 | 5/2004 | Kubena et al. |
| 2004/0108473 | A1 | 6/2004 | Melnychuk et al. |
| 2004/0136715 | A1 | 7/2004 | Kondo |
| 2004/0150991 | A1 | 8/2004 | Ouderkirk et al. |
| 2004/0171272 | A1 | 9/2004 | Jin et al. |
| 2004/0180244 | A1 | 9/2004 | Tour et al. |
| 2004/0184270 | A1 | 9/2004 | Halter |
| 2004/0213375 | A1 | 10/2004 | Bjorkholm et al. |
| 2004/0217297 | A1 | 11/2004 | Moses et al. |
| 2004/0231996 | A1 | 11/2004 | Webb |
| 2004/0240035 | A1 | 12/2004 | Zhikov |
| 2004/0264867 | A1 | 12/2004 | Kondo |
| 2005/0023145 | A1 | 2/2005 | Cohen et al. |
| 2005/0045821 | A1 | 3/2005 | Noji et al. |
| 2005/0045832 | A1 | 3/2005 | Kelly et al. |
| 2005/0054151 | A1 | 3/2005 | Lowther et al. |
| 2005/0067286 | A1 | 3/2005 | Ahn et al. |
| 2005/0082469 | A1 | 4/2005 | Carlo |
| 2005/0092929 | A1 | 5/2005 | Schneiker |
| 2005/0105690 | A1 | 5/2005 | Pau et al. |
| 2005/0145882 | A1 | 7/2005 | Taylor et al. |
| 2005/0162104 | A1 | 7/2005 | Victor et al. |
| 2005/0190637 | A1 | 9/2005 | Ichimura et al. |
| 2005/0194258 | A1 | 9/2005 | Cohen et al. |
| 2005/0201707 | A1 | 9/2005 | Glebov et al. |
| 2005/0201717 | A1 | 9/2005 | Matsumura et al. |
| 2005/0212503 | A1 | 9/2005 | Deibele |
| 2005/0231138 | A1 | 10/2005 | Nakanishi et al. |
| 2005/0249451 | A1 | 11/2005 | Baehr-Jones et al. |
| 2005/0285541 | A1 | 12/2005 | LeChevalier |
| 2006/0007730 | A1 | 1/2006 | Nakamura et al. |
| 2006/0018619 | A1 | 1/2006 | Helffrich et al. |
| 2006/0035173 | A1 | 2/2006 | Davidson et al. |
| 2006/0045418 | A1 | 3/2006 | Cho et al. |

| | | | |
|---|---|---|---|
| 2006/0060782 | A1 | 3/2006 | Khursheed |
| 2006/0062258 | A1 | 3/2006 | Brau et al. |
| 2006/0159131 | A1 | 7/2006 | Liu et al. |
| 2006/0164496 | A1 | 7/2006 | Tokutake et al. |
| 2006/0208667 | A1 | 9/2006 | Lys et al. |
| 2006/0243925 | A1 | 11/2006 | Barker et al. |
| 2006/0274922 | A1 | 12/2006 | Ragsdale |
| 2007/0003781 | A1 | 1/2007 | de Rochemont |
| 2007/0013765 | A1 | 1/2007 | Hudson et al. |
| 2007/0075264 | A1 | 4/2007 | Gorrell et al. |
| 2007/0086915 | A1 | 4/2007 | LeBoeuf et al. |
| 2007/0116420 | A1 | 5/2007 | Estes et al. |
| 2007/0284527 | A1 | 12/2007 | Zani et al. |

FOREIGN PATENT DOCUMENTS

| | | | |
|---|---|---|---|
| JP | 2004-32323 | A | 1/2004 |
| WO | WO 87/01873 | | 3/1987 |
| WO | WO 93/21663 | A1 | 10/1993 |
| WO | WO 00/72413 | | 11/2000 |
| WO | WO 02/025785 | | 3/2002 |
| WO | WO 02/077607 | | 10/2002 |
| WO | WO 2004/086560 | | 10/2004 |
| WO | WO 2005/015143 | A2 | 2/2005 |
| WO | WO 2006/042239 | A2 | 4/2006 |

OTHER PUBLICATIONS

Search Report and Written Opinion mailed Aug. 31, 2007 in PCT Appln. No. PCT/US2006/022680.
Search Report and Written Opinion mailed Jul. 16, 2007 in PCT Appln. No. PCT/US2006/022774.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jun. 20, 2007 in PCT Appln. No. PCT/US2006/022779.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022787.
Search Report and Written Opinion mailed Sep. 5, 2007 in PCT Appln. No. PCT/US2006/027428.
Search Report and Written Opinion mailed Sep. 17, 2007 in PCT Appln. No. PCT/US2006/022689.
"Array of Nanoklystrons for Frequency Agility or Redundancy," NASA's Jet Propulsion Laboratory, NASA Tech Briefs, NPO-21033. 2001.
"Hardware Development Programs," Calabazas Creek Research, Inc. found at http://calcreek.com/hardware.html.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Alford, T.L. et al., "Advanced silver-based metallization patterning for ULSI applications," Microlectronic Engineering 55, 2001, pp. 383-388, Elsevier Science B.V.
Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Electron Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.
Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.
Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.
Chuang, S. L. et al., "Smith-Purcell Radiation from a Charge Moving Above a Penetrable Grating," IEEE MTT-S Digest, 1983, pp. 405-406, IEEE.
Far-IR, Sub-MM & MM Detector Technology Workshop list of manuscripts, session 6 2002.
Feltz, W.F. et al., "Near-Continuous Profiling of Temperature, Mositure, and Atmospheric Stability Using the Atmospheric Emitted Radiance Interferometer (AERI)," Journal of Applied Meteorology, May 2003, vol. 42 No. 5, H.W. Wilson Company, pp. 584-597.
Freund, H.P. et al., "Linerized Field Theory of a Smit-Purcell Traveling Wave Tube," IEEE Transactions on Plasma Science, Jun. 2004, pp. 1015-1027, vol. 32 No. 3, IEEE.
Gallerano, G.P. et al., "Overview of Terahertz Radiation Sources," Proceedings of the 2004 FEL Conference, pp. 216-221.
Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.
Gover, A. et al., "Angular Radiation Pattern of Smith-Purcell Radiation," Journal of the Optical Society of America, Oct. 1984, pp. 723-728, vol. 1 No. 5, Optical Society of America.
Grishin, Yu. A. et al., "Pulsed Orotron—A New Microwave Source for Submillimeter Pulse High-Field Electron Paramagnetic Resonance Spectroscopy," Review of Specific Instruments, Sep. 2004, pp. 2926-2936, vol. 75 No. 9, American Institute of Physics.
Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.
Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.
Ives, Lawrence et al., "Development of Backward Wave Oscillators for Terahertz Applications," Terahertz for Military and Security Applications, Proceedings of SPIE vol. 5070 (2003), pp. 71-82.
Ives, R. Lawrence, "IVEC Summary, Session 2, Sources I" 2002.
Jonietz, Erika, "Nano Antenna Gold nanospheres show path to all-optical computing," Technology Review, Dec. 2005/Jan. 2006, p. 32.
Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA, Nov. 1995, pp. 117-121.
Joo, Youngcheol et al., "Fabrication of Monolithic Microchannels for IC Chip Cooling," 1995, Mechanical, Aerospace and Nuclear Engineering Department, Univerisity of California at Los Angeles.
Jung, K.B. et al., "Patterning of Cu, Co, Fe, and Ag for magnetic nanostructures," J. Vac. Sci. Technol. A 15(3), May/Jun. 1997, pp. 1780-1784.
Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.
Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.
Korbly, S.E. et al., "Progress on a Smith-Purcell Radiation Bunch Length Diagnostic," Plasma Science and Fusion Center, MIT, Cambridge, MA.
Kormann, T. et al., "A Photoelectron Source for the Study of Smith-Purcell Radiation".
Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.
Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.
Manohara, Harish et al., "Field Emission Testing of Carbon Nanotubes for THz Frequency Vacuum Microtube Sources." Abstract. Dec. 2003. from SPIEWeb.
Manohara, Harish M. et al., "Design and Fabrication of a THz Nanoklystron".
Manohara, Harish M. et al., "Design and Fabrication of a THz Nanoklystron" (www.sofia.usra.edu/det_workshop/ posters/session 3/3-43manohara_poster.pdf), PowerPoint Presentation.
McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.
Meyer, Stephan, "Far IR, Sub-MM & MM Detector Technology Workshop Summary," Oct. 2002. (may date the Manohara documents).
Mokhoff, Nicolas, "Optical-speed light detector promises fast space talk," EETimes Online, Mar. 20, 2006, from website: www.eetimes.com/showArticle.jhtml?articleID=183701047.
Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.
Nguyen, Phucanh et al., "Reactive ion etch of patterned and blanket silver thin films in Cl2/O2 and O2 glow discharges," J. Vac. Sci, Technol. B. 17 (5), Sep./Oct. 1999, American Vacuum Society, pp. 2204-2209.
Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.
Phototonics Research, "Surface-Plasmon-Enhanced Random Laser Demonstrated," Phototonics Spectra, Feb. 2005, pp. 112-113.
Platt, C.L. et al., "A New Resonator Design for Smith-Purcell Free Electron Lasers," 6Q19, p. 296.
Potylitsin, A.P., "Resonant Diffraction Radiation and Smith-Purcell Effect," (Abstract), arXiv: physics/9803043 v2 Apr. 13, 1998.
Potylitsyn, A.P., "Resonant Diffraction Radiation and Smith-Purcell Effect," Physics Letters A, Feb. 2, 1998, pp. 112-116, A 238, Elsevier Science B.V.
S. Hoogland et al., "A solution-processed 1.53 μm quantum dot laser with temperature-invariant emission wavelength," Optics Express, vol. 14, No. 8, Apr. 17, 2006, pp. 3273-3281.
Savilov, Andrey V., "Stimulated Wave Scattering in the Smith-Purcell FEL," IEEE Transactions on Plasma Science, Oct. 2001, pp. 820-823, vol. 29 No. 5, IEEE.
Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.
Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.
Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.
Shih, I. et al., "Experimental Investigations of Smith-Purcell Radiation," Journal of the Optical Society of America, Mar. 1990, pp. 351-356, vol. 7, No. 3, Optical Society of America.
Shih, I. et al., "Measurements of Smith-Purcell Radiation," Journal of the Optical Society of America, Mar. 1990, pp. 345-350, vol. 7 No. 3, Optical Society of America.
Swartz, J.C. et al., "THz-FIR Grating Coupled Radiation Source," Plasma Science, 1998. 1D02, p. 126.
Temkin, Richard, "Scanning with Ease Through the Far Infrared," Science, New Series, May 8, 1998, p. 854, vol. 280, No. 5365, American Association for the Advancement of Science.
Walsh, J.E., et al., 1999. From website: http://www.ieee.org/organizations/pubs/newsletters/leos/feb99/hot2.htm.
Wentworth, Stuart M. et al., "Far-Infrared Composite Microbolometers," IEEE MTT-S Digest, 1990, pp. 1309-1310.
Yamamoto, N. et al., "Photon Emission From Silver Particles Induced by a High-Energy Electron Beam," Physical Review B, Nov. 6, 2001, pp. 205419-1-205419-9, vol. 64, The American Physical Society.
Yokoo, K. et al., "Smith-Purcell Radiation at Optical Wavelength Using a Field-Emitter Array," Technical Digest of IVMC, 2003, pp. 77-78.
Zeng, Yuxiao et al., "Processing and encapsulation of silver patterns by using reactive ion etch and ammonia anneal," Materials Chemistry and Physics 66, 2000, pp. 77-82.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Markoff, John, "A Chip That Can Transfer Data Using Laser Light," The New York Times, Sep. 18, 2006.
S.M. Sze, "Semiconductor Devices Physics and Technology", 2nd Edition, Chapters 9 and 12, Copyright 1985, 2002.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.
Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Mar. 7, 2007 in PCT Appln. No. PCT/US2006/022775.
Speller et al., "A Low-Noise MEMS Accelerometer for Unattended Ground Sensor Applications", Applied MEMS Inc., 12200 Parc Crest, Stafford, TX, USA 77477.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
J. C. Palais, "Fiber optic communications," Prentice Hall, New Jersey, 1998, pp. 156-158.
Search Report and Written Opinion mailed Dec. 20, 2007 in PCT Appln. No. PCT/US2006/022771.
Search Report and Written Opinion mailed Jan. 31, 2008 in PCT Appln. No. PCT/US2006/027427.
Search Report and Written Opinion mailed Jan. 8, 2008 in PCT Appln. No. PCT/US2006/028741.
Search Report and Written Opinion mailed Mar. 11, 2008 in PCT Appln No. PCT/US2006/022679.
Search Report and Written Opinion mailed Apr. 23, 2008 in PCT Appln. No. PCT/US2006/022678.
Search Report and Written Opinion mailed Apr. 3, 2008 in PCT Appln. No. PCT/US2006/027429.
Search Report and Written Opinion mailed Jun. 18, 2008 in PCT Appln. No. PCT/US2006/027430.
Search Report and Written Opinion mailed Jun. 3, 2008 in PCT Appln. No. PCT/US2006/022783.

Search Report and Written Opinion mailed Mar. 24, 2008 in PCT Appln. No. PCT/US2006/022677.
Search Report and Written Opinion mailed Mar. 24, 2008 in PCT Appln. No. PCT/US2006/022784.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
International Search Report and Written Opinion mailed Nov. 23, 2007 in International Application No. PCT/US2006/022786.
Search Report and Written Opinion mailed Oct. 25, 2007 in PCT Appln. No. PCT/US2006/022687.
Search Report and Written Opinion mailed Oct. 26, 2007 in PCT Appln. No. PCT/US2006/022675.
Search Report and Written Opinion mailed Sep. 21, 2007 in PCT Appln. No. PCT/US2006/022688.
Search Report and Written Opinion mailed Sep. 25, 2007 in PCT appln. No. PCT/US2006/022681.
Search Report and Written Opinion mailed Sep. 26, 2007 in PCT Appln. No. PCT/US2006/024218.

* cited by examiner

PLATED MULTI-FACETED REFLECTOR

COPYRIGHT NOTICE

A portion of the disclosure of this patent document contains material which is subject to copyright or mask work protection. The copyright or mask work owner has no objection to the facsimile reproduction by any one of the patent document or the patent disclosure, as it appears in the Patent and Trademark Office patent file or records, but otherwise reserves all copyright or mask work rights whatsoever.

CROSS-REFERENCE TO CO-PENDING APPLICATIONS

The present invention is related to the following co-pending U.S. patent applications: (1) U.S. patent application Ser. No. 11/238,991, filed Sep. 30, 2005, entitled "Ultra-Small Resonating Charged Particle Beam Modulator"; (2) U.S. patent application Ser. No. 10/917,511 , filed on Aug. 13, 2004, entitled "Patterning Thin Metal Film by Dry Reactive Ion Etching"; (3) U.S. application Ser. No. 11/203,407 , filed on Aug. 15, 2005, entitled "Method Of Patterning Ultra-Small Structures"; (4) U.S. application Ser. No. 11/243,476 , filed on Oct. 5, 2005, entitled "Structures And Methods For Coupling Energy From An Electromagnetic Wave"; (5) U.S. application Ser. No. 11/243,477 , filed on Oct. 5, 2005, entitled "Electron beam induced resonance,", (6) U.S. application Ser. No. 11/325,432 , entitled "Resonant Structure-Based Display," filed on Jan. 5, 2006; (7) U.S. application Ser. No. 11/325,571 , entitled "Switching Micro-Resonant Structures By Modulating A Beam Of Charged Particles," filed on Jan. 5, 2006; (8) U.S. application Ser. No. 11/325,534 , entitled "Switching Micro-Resonant Structures Using At Least One Director," filed on Jan. 5, 2006; (9) U.S. application Ser. No. 11/350,812 , entitled "Conductive Polymers for the Electroplating", filed on Feb. 10, 2006; (10) U.S. application Ser. No. 11/302,471 , entitled "Coupled Nano-Resonating Energy Emitting Structures," filed on Dec. 14, 2005; and (11) U.S. application Ser. No. 11/325,448 , entitled "Selectable Frequency Light Emitter", filed on Jan. 5, 2006, which are all commonly owned with the present application, the entire contents of each of which are incorporated herein by reference.

FIELD OF THE DISCLOSURE

This disclosure relates to multi-directional electromagnetic radiation output devices, and particularly to ultra-small resonant structures, and arrays formed there from, together with the formation of, in conjunction with and in association with separately formed reflectors, positioned adjacent the ultra-small resonant structures. As the ultra-small resonant structures are excited and produce out put energy, light or other electromagnetic radiation (EMR), that output will be observable in or from multiple directions.

Introduction

Electroplating is well known and is used in a variety of applications, including the production of microelectronics, and in particular the ultra-small resonant structures referenced herein. For example, an integrated circuit can be electroplated with copper to fill structural recesses. In a similar way, a variety of etching techniques can also be used to form ultra-small resonant structures. In this regard, reference can be had to Ser. Nos. 10/917,511 and 11/203,407, previously noted above, and attention is directed to them for further details on each of these techniques, consequently those details do not need to be repeated herein.

Ultra-small structures encompass a range of structure sizes sometimes described as micro- or nano-sized. Objects with dimensions measured in ones, tens or hundreds of microns are described as micro-sized. Objects with dimensions measured in ones, tens or hundreds of nanometers or less are commonly designated nano-sized. Ultra-small hereinafter refers to structures and features ranging in size from hundreds of microns in size to ones of nanometers in size.

The devices of the present invention produce electromagnetic radiation by the excitation of ultra-small resonant structures. The resonant excitation in a device according to the invention is induced by electromagnetic interaction which is caused, e.g., by the passing of a charged particle beam in close proximity to the device. The charged particle beam can include ions (positive or negative), electrons, protons and the like. The beam may be produced by any source, including, e.g., without limitation an ion gun, a tungsten filament, a cathode, a planar vacuum triode, an electron-impact ionizer, a laser ionizer, a chemical ionizer, a thermal ionizer, an ion-impact ionizer.

Plating techniques, in addition to permitting the creation of smooth walled micro structures, also permit the creation of additional, free formed or grown structures that can have a wide variety of side wall or exterior surface characteristics, depending upon the plating parameters. The exterior surface can vary from smooth to very rough structures, and a multitude of degrees of each in between. Such additional ultra small structures can be formed or created adjacent the primary formation or array of ultra-small resonant structures so that when the latter are excited by a beam of charged particles moving there past, such additional ultra-small structures can act as reflectors permitting the out put from the excited ultra-small resonant structures to be directed or view from multiple directions.

A multitude of applications exist for electromagnetic radiating devices that can produce EMR at frequencies spanning the infrared, visible, and ultra-violet spectrums, in multiple directions.

Glossary

As used throughout this document:

The phrase "ultra-small resonant structure" shall mean any structure of any material, type or microscopic size that by its characteristics causes electrons to resonate at a frequency in excess of the microwave frequency.

The term "ultra-small" within the phrase "ultra-small resonant structure" shall mean microscopic structural dimensions and shall include so-called "micro" structures, "nano" structures, or any other very small structures that will produce resonance at frequencies in excess of microwave frequencies.

DESCRIPTION OF PRESENTLY PREFERRED EXAMPLES OF THE INVENTION

Brief Description of Figures

The invention is better understood by reading the following detailed description with reference to the accompanying drawings in which.

DESCRIPTION

Figures 1A, 1B, 1C:
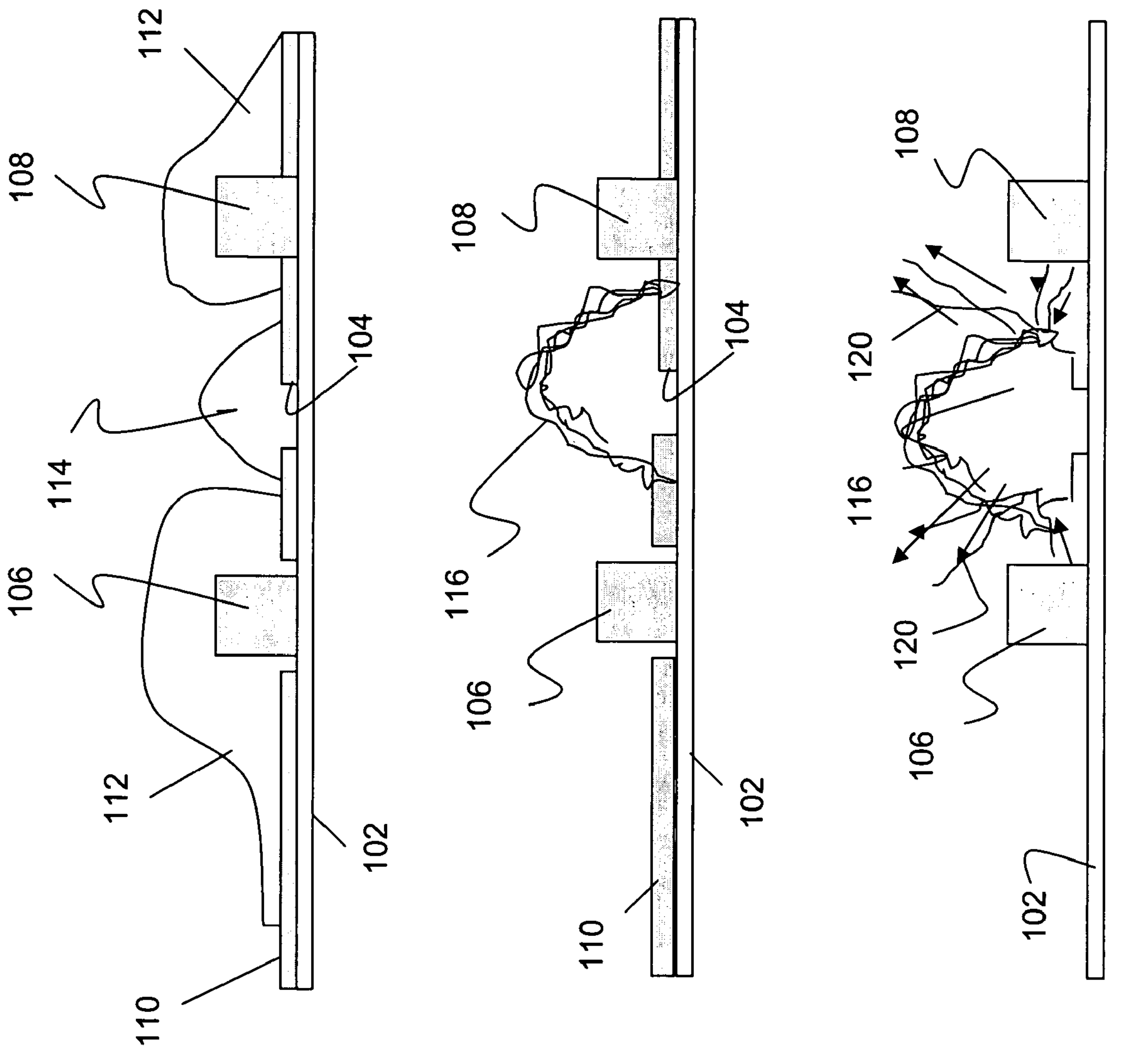
FIGS. 1A-1C comprise a diagrammatic showing of three steps in forming the reflectors.

FIG. 1A is a schematic drawing of selected steps in the process of forming ultra-small resonant structures and the additional structures that will serve as reflectors. It should be understood that the reflectors disclosed herein are deemed novel in their own right, and the invention contemplates the formation and use of reflectors by themselves, as well as in combination with other structures including the ultra-small resonant structures referenced herein and in the above applications. Reference can be made to application Ser. No. 11/203,407 for details on electro plating processing techniques that can be used in the formation of ultra-small resonant structures as well as the additional ultra-small structures that will serve as reflectors, and those techniques will not be repeated herein.

In one presently preferred embodiment, an array of ultra-small resonant structures can be prepared by evaporating a 0.1 to 0.3 nanometer thick layer of nickel (Ni) onto the surface of a silicon (Si) wafer, or a like substrate, to form a conductive layer on that substrate. The artisan will recognize that the substrate need not be silicon. The substrate can be substantially flat and may be either conductive or non-conductive with a conductive layer applied by other means. In the same processing a 10 to 300 nanometer layer of silver (Ag) can then be deposited using electron beam evaporation on top of the nickel layer. Alternative methods of production can also be used to deposit the silver coating. The presence of the nickel layer improves the adherence of silver to the silicon. In an alternate embodiment, a thin carbon (C) layer may be evaporated onto the surface instead of the nickel layers. Alternatively, the conductive layer may comprise indium tin oxide (ITO) or comprise a conductive polymer or other conductive materials.

The now-conductive substrate 102, with the nickel and silver coatings thereon, is coated with a layer of photoresist as is shown in FIG. 1A at 110 or with an insulating layer, for example, silicon nitride (SiNx). In current embodiments, a layer of polymethylmethacrylate (PMMA) is deposited over top of the conductive coating. The PMMA may be diluted to produce a continuous layer of 200 nanometers. The photoresist layer is exposed with a scanning electron microscope (SEM) and developed to produce a pattern of the desired device structure. The patterned substrate is positioned in an electroplating bath. A range of alternate examples of photoresists, both negative and positive in type, can be used to coat the conductive surface and then patterned to create the desired structure. In FIG. 1A, ultra-small resonant structures are shown at 106 and 108 as having been previously formed in the patterned layer of photoresist or an insulating layer 110. FIG. 1A also shows the next step of depositing an additional photoresist material 112 on top of and covering the existing previously deposited photoresist or insulating layer 110 and covering the ultra-small resonant structures 106 and 108. An opening is then formed in the material 112, down to the opening 104 that remains in the material 110, and in subsequent processing a free formed, or unconstrained structure 114 is in the process of being formed.

FIG. 1B shows the free formed, or unconstrained, structure 116 that has resulted from further electro plating processing and with the additional photoresist material or insulating 112 removed. It should be understood that the formation process, for these additional structures, can be controlled very precisely so that it is possible to form any size or shape additional structures, and to control the nature of the exterior surface of those additional structures.

FIG. 1C shows the result following removal of the initial photoresist layer 110 which leaves the ultra-small resonant structures 106 and 108 as well as the additional structure 116 formed there between. It should be noted that this photoresist or insulating layer does not need to be removed, but can be left in place. This additional structure 116 can have a wide variety of side wall morphologies varying from smooth to very rough, so that a number of surfaces thereof can be reflective surfaces, including all or portions of the sides, the top and a variety of angled or other surfaces there between. For reflection purposes it is preferred to have the outer surface of the additional structure 116 formed with a very rough exterior. Light or other EMR emanating from each of the ultra-small resonant structures 106 and 108, in the direction of the additional structure 116, can then be reflected by the exterior of that additional structure 116 in a multiple of directions as indicated at 120. As a result, various devices for receiving the produced EMR, such as light and colors, which can vary from optical pick up devices to the human eye, will be able to see the reflected energy from multiple directions.

Figures 2A, 2B, 2C:
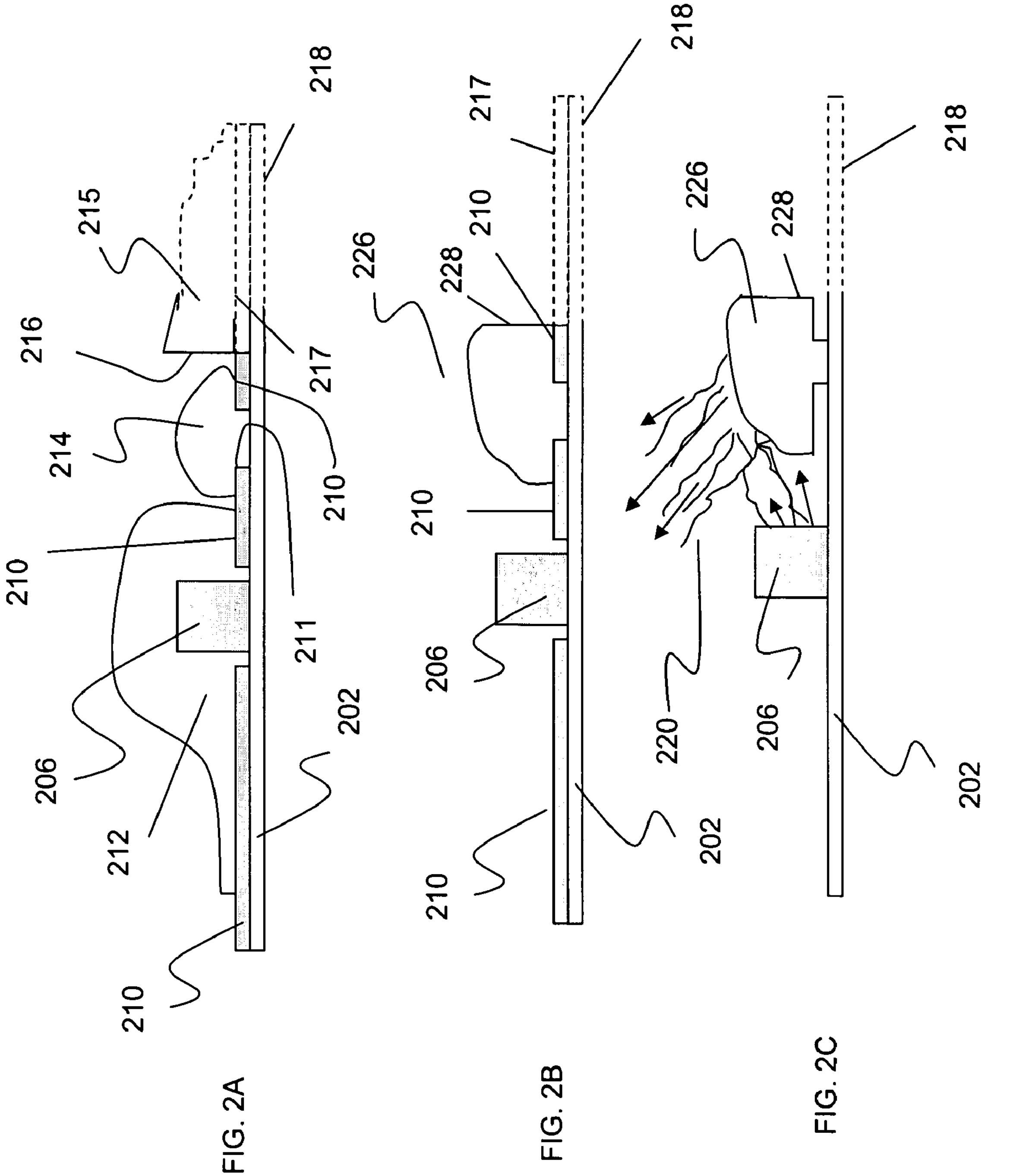
FIG. 2A-2E comprise a diagrammatic showing of forming a reflector having an alternative shape.

FIG. 2A shows another embodiment where the substrate 202, on which the Ni and Ag has been applied, has already had a layer of photoresist or insulating material 210 deposited and an ultra-small resonant structure 206 has been formed. An additional amount of photoresist 212 has been deposited over the first photoresist 210 and over the ultra-small resonant structure 206. To the right of the ultra-small resonant structure 206 an opening 211 has been made in the photoresist layer 210, and additional photoresist material 215 has been deposited on the right side of the substrate 202. The outer portion is shown in dotted line to indicate that this photoresist material 215 can extend to the edge of the substrate 202 whether that edge is near the opening 211 or the outer edge of a chip or circuit board, as shown in the solid lines, or farther away as shown by the dotted lines. This additional photoresist material 215 is also formed with a flat, vertical interior surface 216. Subsequent electroplating steps will then begin the process of forming or growing an additional structure which is shown in an initial stage of development at 214. It should be understood that the photoresist material could be shaped in any desired manner so that some portion of the additional structure subsequently being formed can then take on the mirror image of that shaped structure. Thus, flat walls, curved walls, angled or angular surfaces, as well as many other shapes or exterior surfaces, in addition to rough exterior surfaces, could be created to accomplish a variety of desired results as a designer might desire. For example, it might be desired to have a particular angle or shape formed on a reflector surface to angle or focus the produced energy put in a particular direction or way.

FIG. 2B demonstrates that the additional structure 226 has been formed and with the material 215 removed, or not since removal is not required, the additional structure 226 has a flat exterior wall surface 228 where it was in contact with photoresist material at the surface 216.

FIG. 2C shows that all of the photoresist material has been removed, even though it does not need to be, leaving the ultra-small resonant structure 206 and the additional structure 226 on substrate 202. As shown by the lines 220, light or energy produced by the ultra-small resonant structure 206 when excited and which is directed toward the additional structure 226 will be reflected in multiple directions by the rough exterior surface thereon.

Figure 2D:
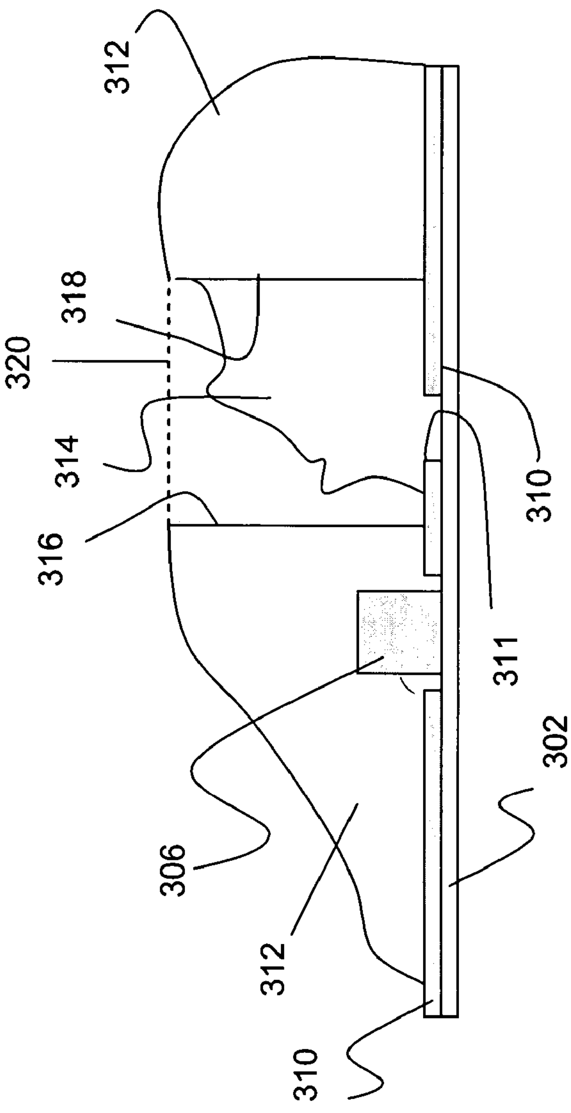
Figure 2E:
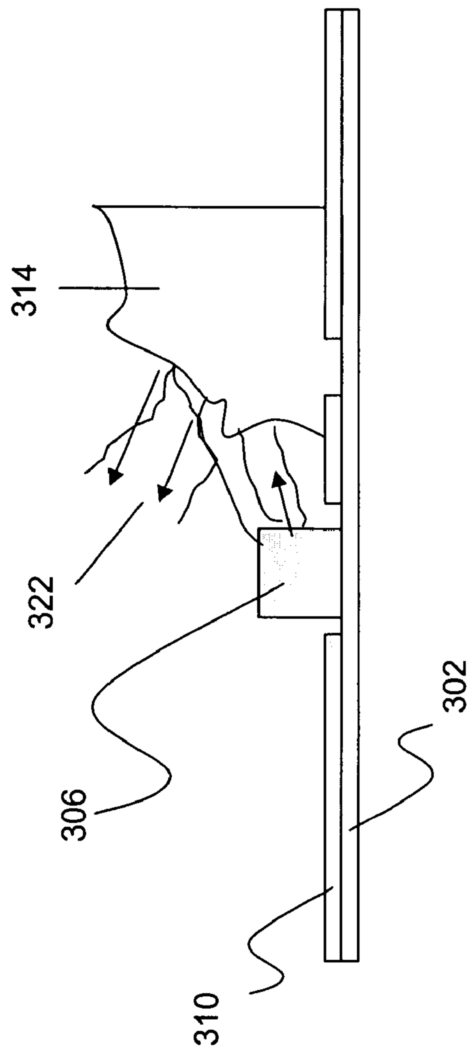

In FIG. 2D another embodiment is shown where the substrate 302, similar to the substrates described above, has been coated with a layer of photoresist or an insulating layer 310 and an ultra-small resonant structure 306 has been formed. Additional photoresist material has been deposited over the whole substrate and a hole has been formed down to the substrate and layer 310 as indicated by the dotted line at 320. This has also formed the two opposing vertical walls 316 and 318. The subsequent electro plating will form the structure 314 where one side has developed in an unconstrained way and is irregular while the portion in contact with wall 318 is flat and relatively smooth, and a mirror image of wall 318. Once the material 312 is removed, as shown in FIG. 2E, the ultra-small resonant structure 306 and the additional ultra-small structure 314 remain. The additional ultra-small structure 314 will act as a reflector of the EMR or light emitted by 306 as shown by the waves 322.

It should be understood that a wide variety of shapes, sizes and styles of ultra-small resonant structures can be produced, as identified and described in the above referenced applications, all of which are incorporated by reference herein. Consequently, FIGS. 3 and 4 show only two exemplary arrays of ultra-small resonant structures where reflectors 116/226, like those described above, have been formed outside of the arrays.

Figure 3:
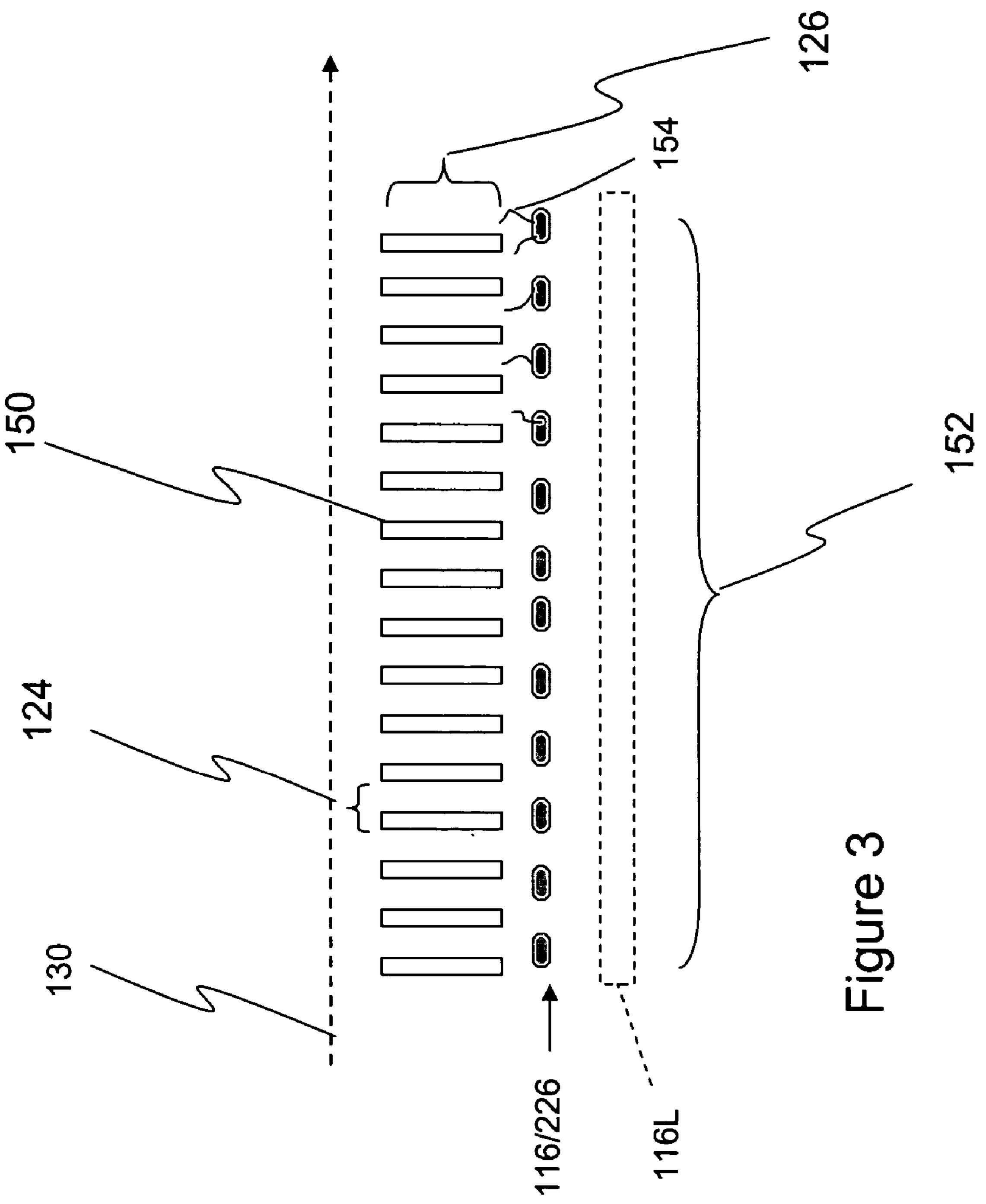
FIG. 3 shows one exemplary configuration of ultra-small resonant structures and the additional reflectors.

In FIG. 3 an array 152 of a plurality of ultra-small resonant structures 150 is shown with spacings between them 124 that extend from the front of one ultra-small resonant structure to the front of the next adjacent structure, and with widths 126. A beam of charged particles 130 is being directed past the array 152 and a plurality of segmented or separately formed reflectors 116/226 are located on the side of the array 152 opposite to the side where beam 130 is passing. Consequently, light or other EMR being produced by the excited array 152 of ultra-small resonant structures 150 will be reflected as shown at 154 in a multiple of directions by the reflectors 116/226. While a plurality of separately formed reflectors are shown, it is also possible to form or grow one elongated reflector as shown in dotted line at 116L.

Figure 4:
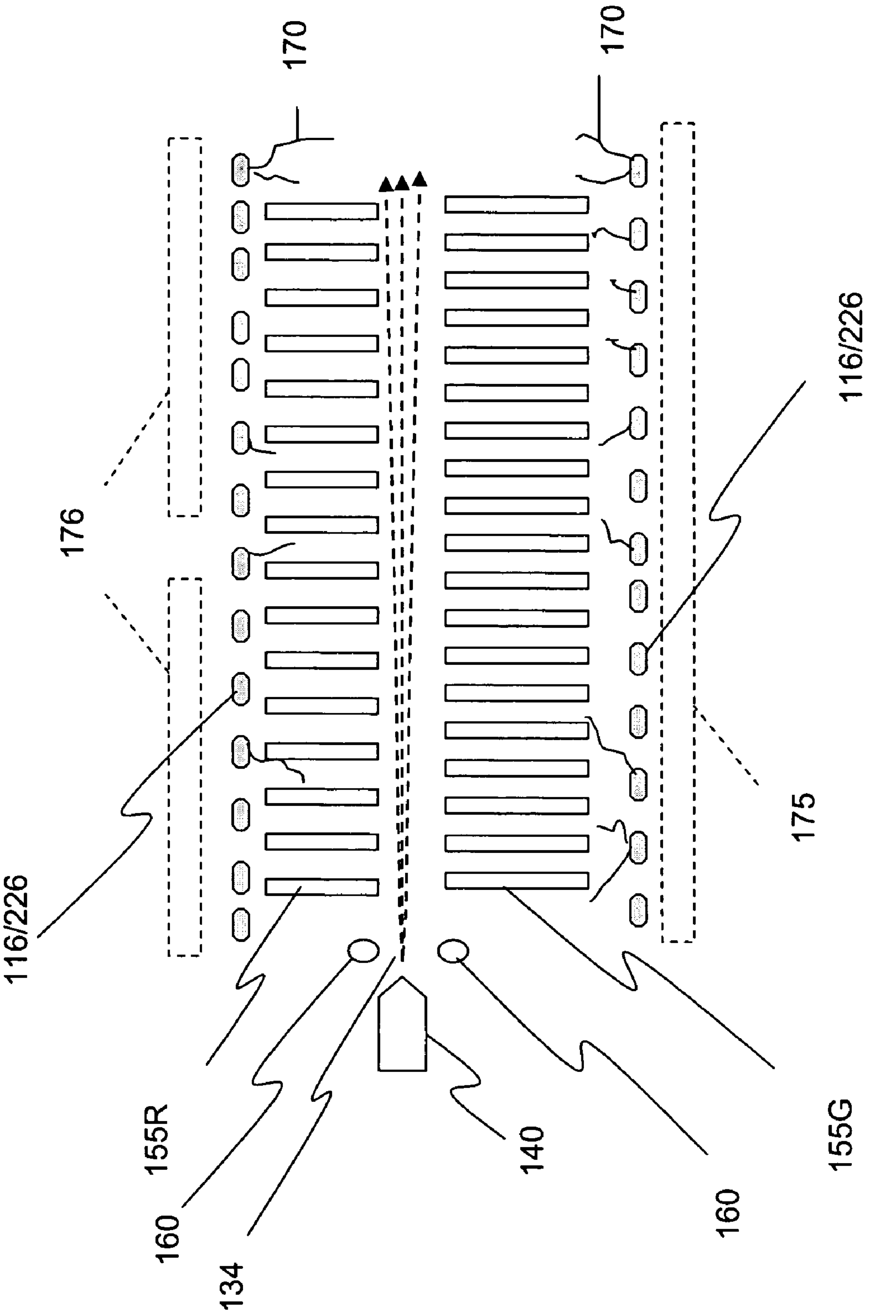
FIG. 4 shows another exemplary configuration of ultra-small resonant structures and additional reflectors.

FIG. 4 shows an embodiment employing two parallel arrays of ultra-small resonant structures, 155R and 155G, designating then as being red and green light producing ultra-small resonant structures. A beam of charged particles 134 being generated by a source 140 and deflected by deflectors 160 as shown by the multiple paths of that beam 134. The red and green light producing ultra-small resonant structures 155R and 155G are being exited by beam 134 and the light being produced is being reflected by the additional structures 116/226 located along the arrays and on each side of the arrays opposite where beam 134 is passing. This reflected light is shown at 170, and because the exterior surface of the additional structures 116/226 is rough the reflected light will be visible in multiple of directions. While the reflectors have been shown as being segmented or spaced apart, they could also be in the form of one elongated reflector structure 175, or as several elongated reflector structures as shown at 176.

It should be understood that while a small oval structure, or the elongated rectangles at 116L, 175 and 176, respectively, are being used in FIGS. 3 and 4 to represent the reflector structures, these reflectors can have a wide variety of shapes, as noted previously above, and these representations in FIGS. 3 and 4 should not be viewed as being limiting in any way. Further, the invention also comprises the reflectors themselves on a suitable substrate.

A wide range of morphologies can be achieved in forming the additional structures to be used as reflectors, for example, by altering parameters such as peak voltage, pulse widths, and rest times. Consequently, many exterior surface types and forms can be produced allowing a wide range of reflector surfaces depending upon the results desired.

Nano-resonating structures can be constructed with many types of materials. Examples of suitable fabrication materials include silver, copper, gold, and other high conductivity metals, and high temperature superconducting materials. The material may be opaque or semi-transparent. In the above-identified patent applications, ultra-small structures for producing electromagnetic radiation are disclosed, and methods of making the same. In at least one embodiment, the resonant structures of the present invention are made from at least one layer of metal (e.g., silver, gold, aluminum, platinum or copper or alloys made with such metals); however, multiple layers and non-metallic structures (e.g., carbon nanotubes and high temperature superconductors) can be utilized, as long as the structures are excited by the passage of a charged particle beam. The materials making up the resonant structures may be deposited on a substrate and then etched, electroplated, or otherwise processed to create a number of individual resonant elements. The material need not even be a contiguous layer, but can be a series of resonant elements individually present on a substrate. The materials making up the resonant elements can be produced by a variety of methods, such as by pulsed-plating, depositing or etching. Preferred methods for doing so are described in co-pending U.S. application Ser. Nos. 10/917,571 and No. 11/203,407, both of which were previously referenced above and incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. A nano-resonating structure comprising:

an array of at least two ultra-small resonant structures mounted on a substrate, a source of charged particles arranged to excite and cause the ultra-small resonant structures to resonate to thereby produce EMR, and a plurality of additional structures positioned adjacent the ultra-small resonant structures so that at least a portion of an exterior surface of the additional structures will act as a reflector of at least a portion of the EMR being produced.

2. The nano-resonating structure as in claim 1 wherein the additional structures comprise elongated structures extending along at least a portion of the array.

3. The nano-resonating structure as in claim 1 wherein each of the plurality of additional structures comprises an ultra small structure arranged as a series of spaced apart individual reflectors.

4. The nano-resonating structure as in claim 1 wherein the additional structures have a rough exterior surface.

5. The nano-resonating structure as in claim 1 wherein the additional structures have at least one angled reflecting surface.

6. The nano-resonating structure as in claim 1 wherein the additional structures have a surface that will reflect and focus EMR directed there towards.

7. The nano-resonating structure as in claim 1 wherein the additional structures exhibit a multi-directional reflecting exterior surface.

8. The nano-resonating structure as in claim 1 wherein the additional structures are positioned on one side of the array.

9. The nano-resonating structure as in claim 1 wherein the additional structures are positioned on two sides of the array.

10. The nano-resonating structure as in claim 1 wherein the additional structures are positioned on opposite sides of the array.

11. The nano-resonating structure as in claim 1 further including a plurality of additional structures that are segmented and spaced apart along the array.

12. The nano-resonating structure as in claim 1 wherein all of the EMR is produced by the at least two ultra-small resonant structures.

13. A nano-reflecting structure comprising:

a substrate an array of ultra-small resonant structures formed on the substrate and being in a line spaced apart from each other, the line being adjacent to but not directly in the path of a passing charged particle beam so the ultra-small resonant structures receive energy from the charged particle beam and become excited to emit EMR; and a nano-structure other than the ultra-small resonant structures having an exterior surface in a path of the emitted EMR being irregularly shaped so as to have a variety of side wall morphologies that will reflect the EMR directed there toward in a multiple of directions including back toward the ultra-small resonant structure.

14. The nano-reflecting structure as in claim 13 wherein the exterior surface is multi-faceted to reflect EMR in a plurality of directions.

15. The nano-reflecting structure as in claim 13 wherein the nano-structure comprises a series of spaced apart structures.

16. The nano-reflecting structure as in claim 13 wherein the nano-structure comprises an elongated structure.

17. The nano-reflecting structure as in claim 13 further comprising a plurality of nano-structures each having a multi-faceted exterior capable of reflecting at least a portion of EMR directed there toward.

18. The nano-reflecting structure as in claim 17 wherein the nano-reflecting structure reflects in a multi-directional manner.

19. The nano-reflecting structure as in claim 13 wherein the at least one portion of an exterior surface that is reflecting comprises a side surface.

20. The nano-reflecting structure as in claim 13 wherein the at least one portion of an exterior surface that is reflecting comprises a top surface.

* * * * *